(12) United States Patent
Andreev et al.

(10) Patent No.: US 8,151,160 B1
(45) Date of Patent: Apr. 3, 2012

(54) CONFIGURABLE LOW-DENSITY PARITY-CHECK DECODER FOR LDPC CODES OF ARBITRARY BLOCK SIZE AND METHOD OF CONFIGURING THE SAME

(75) Inventors: Alexander E. Andreev, San Jose, CA (US); Igor A. Vikhliantsev, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 999 days.

(21) Appl. No.: 12/117,840

(22) Filed: May 9, 2008

(51) Int. Cl.
*H03M 13/00* (2006.01)

(52) U.S. Cl. ...................................... 714/752
(58) Field of Classification Search .................. 714/752
See application file for complete search history.

(56) References Cited

U.S. PATENT DOCUMENTS

| | | | |
|---|---|---|---|
| 4,338,675 A | 7/1982 | Palmer et al. | |
| 5,652,718 A | 7/1997 | Thomson et al. | |
| 6,877,019 B2 | 4/2005 | Bandy et al. | |
| 7,725,810 B2 * | 5/2010 | Paumier et al. | 714/800 |
| 7,966,544 B2 * | 6/2011 | Paumier et al. | 714/755 |
| 2005/0138519 A1 | 6/2005 | Boutillon et al. | |
| 2007/0094565 A1 * | 4/2007 | Paumier et al. | 714/752 |
| 2007/0283209 A1 * | 12/2007 | Paumier et al. | 714/752 |

OTHER PUBLICATIONS

Guilloud et al., "Delta-Min Decoding Algorithm of Regular and Irregular LDPC Codes" Proc. 3rd Int. Symp. on Turbo Codes & Related Topics Sep. 1-5, 2003.
Rovini et al., "Multi-Size Circular Shifting Networks for Decoders of Structured LDPC Codes" Electronics Letters, vol. 43, No. 17, pp. 938-940, Aug. 16, 2007.

* cited by examiner

*Primary Examiner* — Amine Riad (57) ABSTRACT

A configurable low-density parity check code (LDPC) decoder and a method of configuring the decoder. In one embodiment, the configurable LDPC decoder includes: (1) pluralities of parity check units and bit node units, (2) direct and reverse multi-size barrel shifters coupled to the pluralities of parity check units and bit node units and (3) a control circuit, coupled to the pluralities of parity check units and bit node units and the direct and reverse multi-size barrel shifters and configured to configure sizes of the direct and reverse multi-size barrel shifters and numbers of the pluralities of parity check units and bit node units to cooperate therewith based on a block size of a particular LDPC code.

19 Claims, 6 Drawing Sheets

CONFIGURABLE LOW-DENSITY PARITY-CHECK DECODER FOR LDPC CODES OF ARBITRARY BLOCK SIZE AND METHOD OF CONFIGURING THE SAME

TECHNICAL FIELD

The invention is directed, in general, to encoders and decoders that employ error-correcting codes and, more specifically, to a configurable low-density parity-check (LDPC) decoder for codes of arbitrary block size and a method of configuring such a decoder.

BACKGROUND

Communication networks have been under continual development for many years. An important attribute of most communication networks is bandwidth. For practical purposes, the bandwidth of a particular network is not gauged on the raw rate at which bits can be transmitted through it, but rather on the rate at which uncorrupted data can be transmitted. Error correction codes (ECCs) allow errors to be identified and perhaps the data recovered without requiring its retransmission. However, ECCs are transmitted with the data and therefore add overhead to it. They also must be encoded and decoded in real-time, as the data is being transmitted. Thus, choosing the best ECC for a particular application has often involved striking a compromise among ECC effectiveness, ECC computational complexity, ECC overhead and the speed at which unrecoverable data can be retransmitted.

The well-known Shannon limit dictates the theoretical maximum bandwidth of a particular channel in a communication network. One type of ECC, the low-density parity check (LDPC) code, adds very little overhead and therefore allows data rates closely to approach the Shannon limit. However, while LDPC codes were developed as a theoretical exercise in the 1960s, their computational complexity and memory requirements have kept them from being used in actual communication networks. However, owing to the ever-increasing processing power and storage capacity available to transmitters and receivers in communication networks, that is now changing.

Emerging standards (including those directed to high-speed wireline Ethernet networks, such as IEEE 802.3an or 10GBASE-T, and wireless networks in the context of IEEE 802.11, such as IEEE 802.11n and 802.16e) specify LDPC codes. However, the LDPC codes specified in the various standards are all of different codeword lengths and block sizes. Thus, a different decoder must be designed to accommodate each standard.

SUMMARY

To address the above-discussed deficiencies of the prior art, one aspect of the invention provides a configurable LDPC decoder. In one embodiment, the configurable LDPC decoder includes: (1) pluralities of parity check units and bit node units, (2) direct and reverse multi-size barrel shifters coupled to the pluralities of parity check units and bit node units and (3) a control circuit, coupled to the pluralities of parity check units and bit node units and the direct and reverse multi-size barrel shifters and configured to configure sizes of the direct and reverse multi-size barrel shifters and numbers of the pluralities of parity check units and bit node units to cooperate therewith based on a block size of a particular LDPC code.

In another embodiment, the configurable LDPC decoder includes: (1) pluralities of parity check units and bit node units, (2) direct and reverse multi-size (m,n) barrel-shifters coupled to the pluralities of parity check units and bit node units, each of the direct and reverse multi-size (m,n) barrel-shifters including two n-barrel shifters and control circuitry configured to shift chunks of data therein and select the chunks for output thereby and (3) a control circuit, coupled to the pluralities of parity check units and bit node units and the direct and reverse multi-size (m,n) barrel-shifters and configured to configure sizes of the direct and reverse multi-size (m,n) barrel-shifters and numbers of the pluralities of parity check units and bit node units to cooperate therewith based on a block size of a particular LDPC code such that the LDPC decoder achieves $\lambda$-min decoding.

Another aspect of the invention provides a method of configuring a configurable LDPC decoder having pluralities of parity check units and bit node units and direct and reverse multi-size barrel shifters coupled to the pluralities of parity check units and bit node units. In one embodiment, the method includes: (1) configuring sizes of the direct and reverse multi-size barrel shifters based on a block size of a particular LDPC code and (2) configuring numbers of the pluralities of parity check units and bit node units to cooperate therewith based on the block size.

The foregoing has outlined certain aspects and embodiments of the invention so that those skilled in the pertinent art may better understand the detailed description of the invention that follows. Additional aspects and embodiments will be described hereinafter that form the subject of the claims of the invention. Those skilled in the pertinent art should appreciate that they can readily use the disclosed aspects and embodiments as a basis for designing or modifying other structures for carrying out the same purposes of the invention. Those skilled in the pertinent art should also realize that such equivalent constructions do not depart from the scope of the invention.

BRIEF DESCRIPTION OF THE DRAWINGS

For a more complete understanding of the invention, reference is now made to the following descriptions taken in conjunction with the accompanying drawings, in which.

DETAILED DESCRIPTION OF CERTAIN ASPECTS AND EMBODIMENTS

It is desirable to have an LDPC decoder that can fit any standard. Described herein are various embodiments of an LDPC decoder having modular arithmetic units such that it can be configured to decode LDPC codes having arbitrary block sizes and various embodiments of methods for configuring the configurable LDPC decoder for decoding an LDPC code having a particular block size. The configurable LDPC decoder can be applied to any existing and future standards (e.g., IEEE 802.11n and 802.16e. The data rate and area of the configurable LDPC decoder can be adjusted by increasing or decreasing its parallelism, i.e., by changing of number of its arithmetic units.

Figure 1:
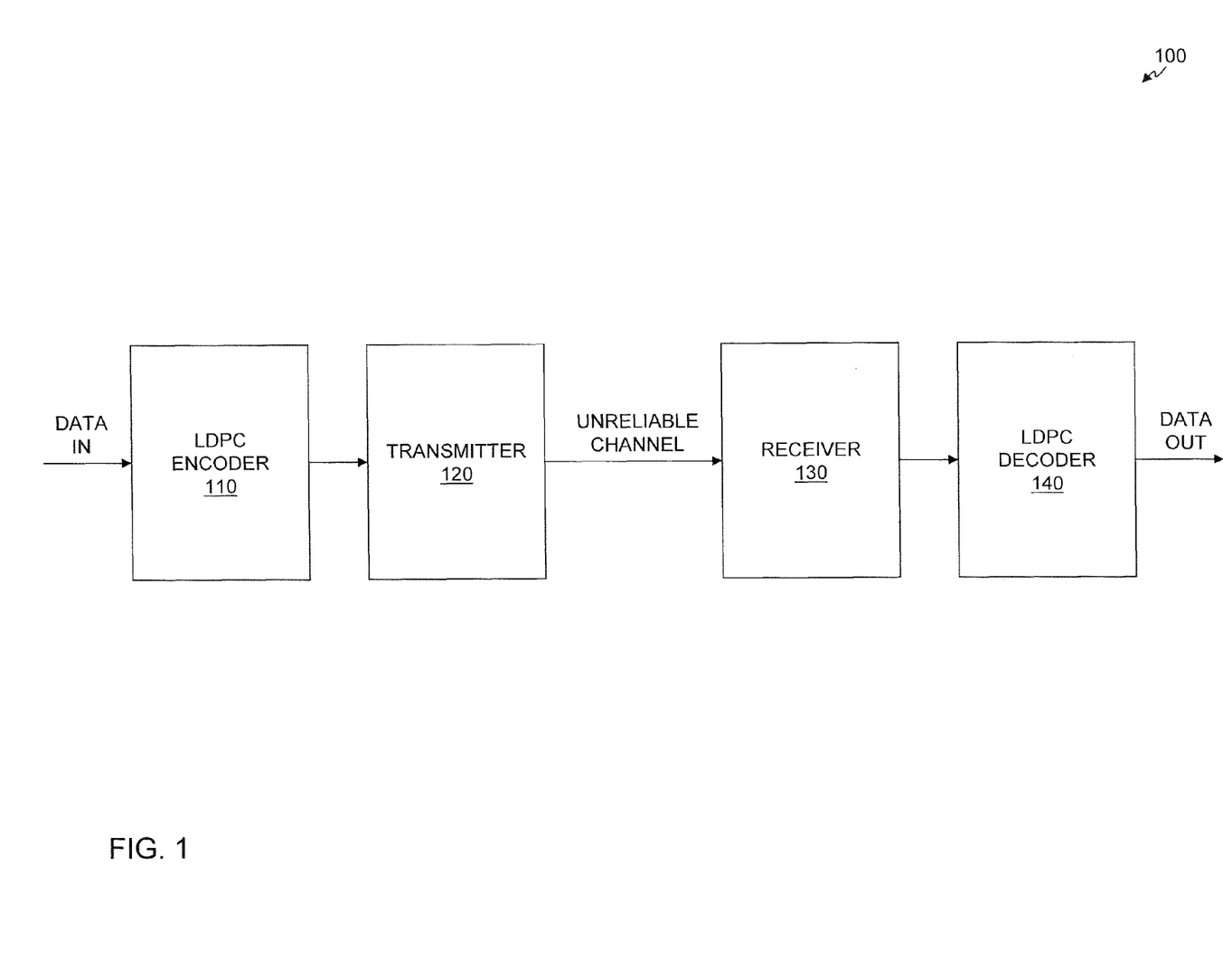
FIG. 1 is a block diagram of a portion of a communication network that makes use of LDPC codes and forms an environment within which an LDPC decoder configurable for LDPC codes of arbitrary block size operates.

FIG. 1 is a block diagram of a portion 100 of a communication network that makes use of LDPC codes and forms an environment within which an LDPC decoder configurable for LDPC codes of arbitrary block size operates. The network takes data into an LDPC encoder 110, which divides the data into blocks of a certain size depending upon the communication standard under which the network happens to be operating, develops LDPC codes for each of the blocks and associates the codes with the blocks, typically in a header. The data, along with its LDPC codes, is passed to a transmitter 120. The transmitter 120 transmits the data over an unreliable channel. "Unreliable" means that the channel data is not designed to guarantee that data will arrive error-free; the data may become corrupted as it is conveyed through the channel. The channel may be wireline or wireless.

A receiver 130 receives the data, passing it and the LDPC codes to a configurable LDPC decoder 140. The configurable LDPC decoder 140 employs the LDPC codes to check and correct errors in the blocks of data. Retransmission is only necessary when the number of errors in a given block exceeds the capacity of the corresponding LDPC code to correct errors. Ultimately, the configurable LDPC decoder 140 provides the data to subsequent circuitry for further processing or storage.

As stated above, the invention is generally related to LDPC decoding. As such, the configurable LDPC decoder 140 is configurable such that it can decode LDPC codes of different lengths. This capability allows a particular LDPC decoder to operate in accordance with different standards.

Figure 2:
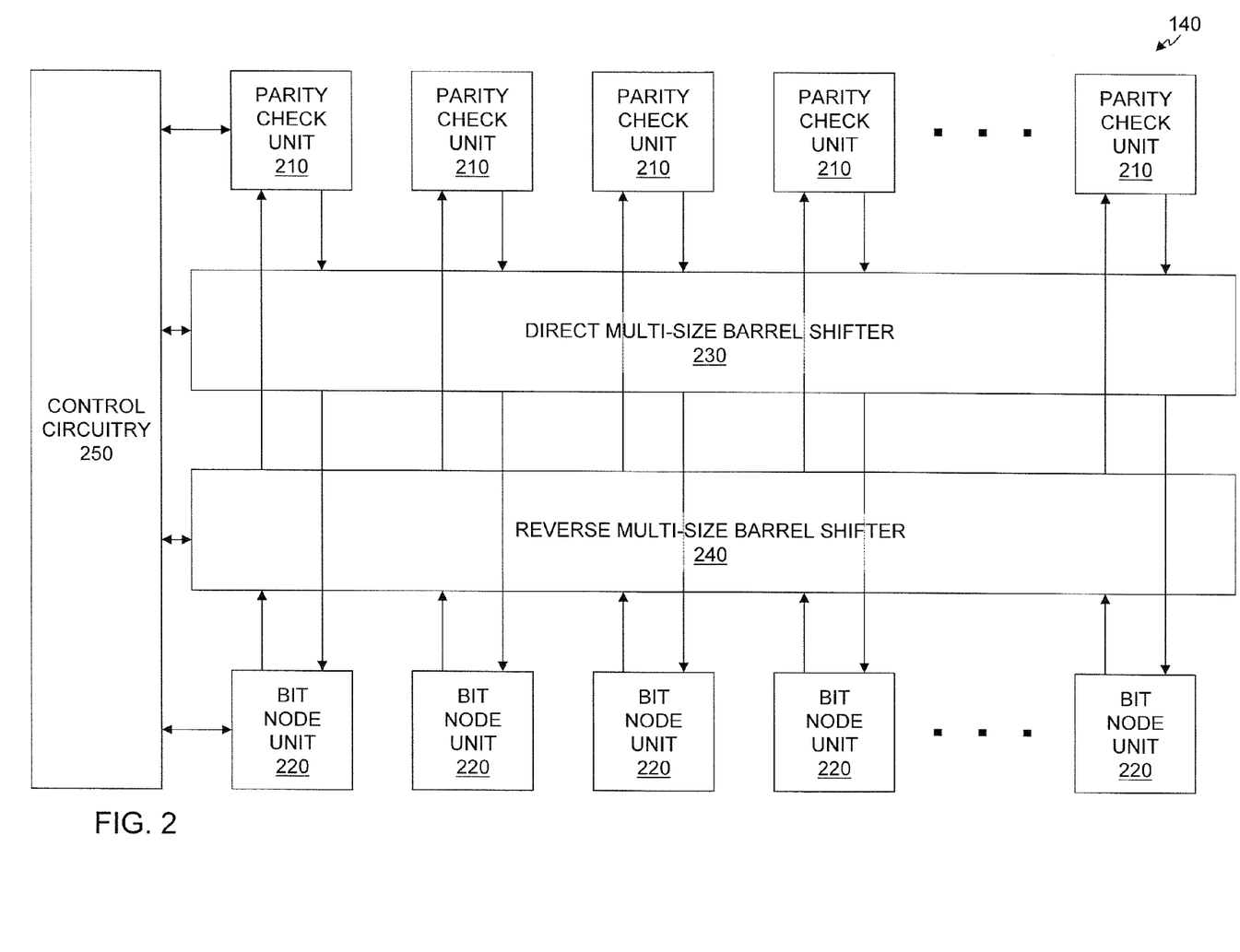
FIG. 2 is a high-level block diagram of one embodiment of a configurable LDPC decoder constructed according to the principles of the invention.

FIG. 2 is a high-level block diagram of one embodiment of the configurable LDPC decoder of FIG. 1 constructed according to the principles of the invention. The configurable LDPC decoder 140 includes a plurality of parity check units 210, a plurality of bit node units 220 and two multi-size barrel shifters that pass bits among the plurality of parity check units 210 and the plurality of bit node units 220. One multi-size barrel shifter rotates bits in one direction and is called a direct multi-size barrel shifter 230. The other multi-size barrel shifter rotates bits in the opposite direction and is called a reverse multi-size barrel shifter 240. As various arrows in FIG. 2 indicate, the plurality of parity check units 210 receive bits from the reverse multi-size barrel shifter 240 and provide bits to the direct multi-size barrel shifter 230. In contrast, the plurality of bit node units 220 receive bits from the direct multi-size barrel shifter 230 and provide bits to the reverse multi-size barrel shifter 240. The direct multi-size barrel shifter 230 and the reverse multi-size barrel shifter 240 are each capable of assuming a desired size (or length).

A control circuit 250 is coupled to the pluralities of parity check units and bit node units 210, 220 and the direct and reverse multi-size barrel shifters 230, 240. The control circuit 250 operates to configure the configurable LDPC decoder 500 to decode an LDPC code having a particular block size by configuring the sizes of the direct and reverse multi-size barrel shifters 230, 240 and the numbers of the pluralities of parity check units and bit node units 210, 220 that are to cooperate therewith based on the block size. The manner in which the control circuit 250 may configure these sizes and numbers will be described below.

For purposes of discussing the illustrated embodiment of the configurable LDPC decoder 140 below, the variable numb_unit denotes the number of the plurality of parity check units 210 and the number of the plurality of bit node units 220 to be employed in a particular configuration, and the variables numb_par_unit and numb_unit denotes the size (in terms of inputs and outputs) of each of the direct multi-size barrel shifter 230 and the reverse multi-size barrel shifter 240 to be employed in a particular configuration. Thus, in the illustrated embodiment, the number of parity check units 210 employed in a particular configuration equals the number of bit node units 220 employed in that configuration, and the length of the direct multi-size barrel shifter 230 employed in a particular configuration equals the length of the reverse multi-size barrel shifter 240 employed in that configuration.

In the illustrated embodiment, the number of parity check units 210 and the number of bit node units 220 employed in a particular configuration are such that λ-min decoding is achieved. Those skilled in the pertinent art are familiar with λ-min decoding and the processing that occurs in each parity check unit and a bit node unit of a conventional LDPC decoder to enable λ-min decoding. An understanding of λ-min decoding is therefore not necessary to an understanding of the principles underlying the configurable LDPC decoder and method of configuring the same that is introduced herein. Nonetheless, detailed discussions regarding λ-min decoding may be found in the prior art, e.g., Guilloud, et al., "λ-min Decoding Algorithm of Regular and Irregular LDPC Codes," in Proc. $3^{rd}$ Int. Symp. on Turbo Codes & Related Topics, Sep. 1-5, 2003, and U.S. Patent Application Publication No. 2005/0138519, by Boutillon, et al., dated Jun. 23, 2005, and entitled "LDPC Decoder, Corresponding Method, System and Computer Program." Both of these documents are incorporated herein by reference.

The direct multi-size barrel shifter 230 and the reverse multi-size barrel shifter 240 may be of any architecture whatsoever. The only requirement the imposed is that the direct multi-size barrel shifter 230 and the reverse multi-size barrel shifter 240 be configurable to assume a particular size such that they can cooperate with a configurable number of parity check units 210 and bit node units 220. For example, U.S. Pat. Nos. 4,338,675, 5,652,718 and 6,877,019 describe barrel shifter architectures that may be employed in the context of a configurable LDPC decoder.

In one embodiment, the configurable LDPC decoder employs a high-speed barrel shifter of configurable size. Before describing one embodiment of the high-speed barrel shifter in detail, the operation of barrel-shifting will be described in general.

In general, barrel shifters are combinational logic circuits that can shift or rotate data by any number of bits (units) in a single operation spanning one or more clock cycles. In the context of the configurable LDPC decoder, the barrel shifters perform a rotate operation. As used herein, an n circular barrel shifter is a circuit that can cyclically shift a sequence, or "chunk," of n bits a specified number of positions in the shifter. An n-barrel shifter has n data inputs, n data outputs, $\log_2 n$ logic levels (depth) with $$\frac{n}{2}$$

switches on each level and performs the function:

OUT[(i+shift)(mod n)]=INP[i], ∀i=0, 1, ..., n−1, where OUT[i] is the shifter's $i^{th}$ data output, INP[i] is the shifter's $i^{th}$ data input, and shift is the number of positions by which the data is shifted.

An (m, n) multi-size circular barrel shifter (where m≦n) is a circuit that can cyclically shift a chunk of m bits from a total of n bits a specified number of positions in the shifter. An (m,n) multi-size circular barrel shifter has n data inputs and n outputs and performs the function:

OUT[(i+shift)(mod m)]=INP[i], ∀i=0, 1, ... m−1,

OUT[i]=*, ∀i=m, ..., n−1.

As above, OUT[i] is the shifter's $i^{th}$ data output, INP[i] is the shifter's $i^{th}$ data input, and shift is the number of positions by which the data is shifted.

Figure 3:
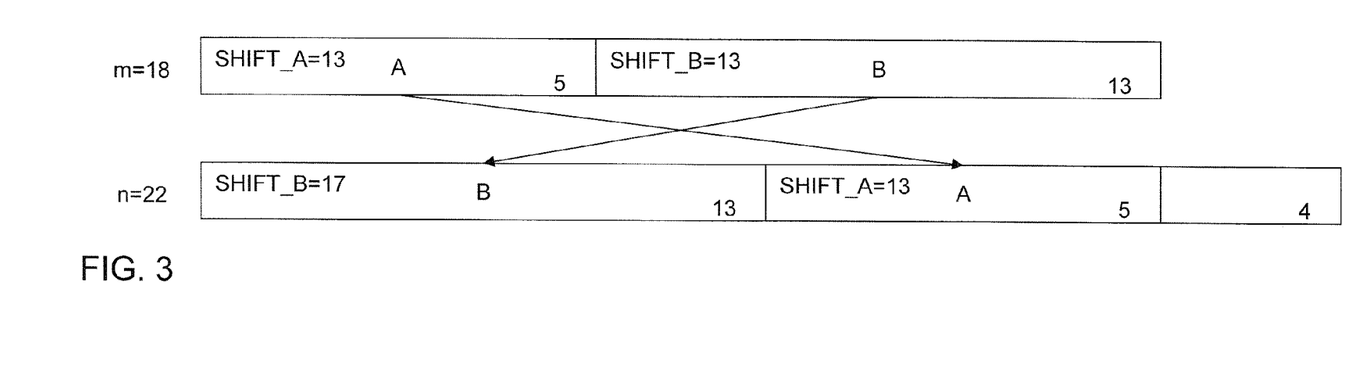
FIG. 3 is a diagram illustrating an example of a dual shift.
Figure 4:
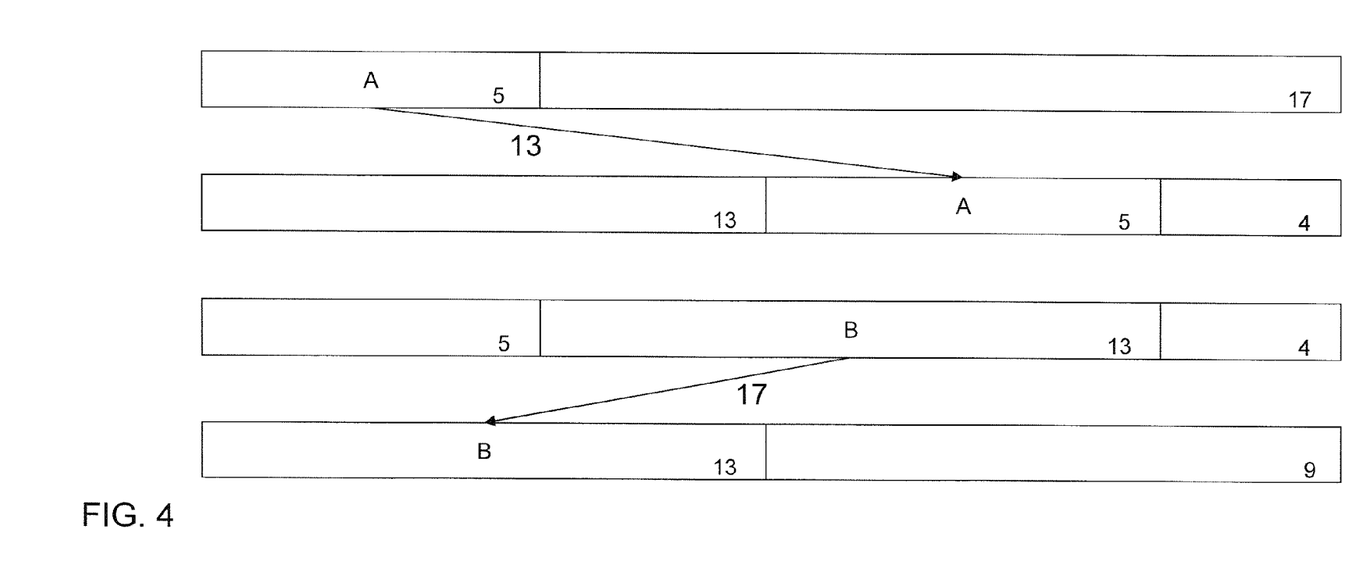
FIG. 4 is a more detailed diagram illustrating an example of the dual shift of FIG. 3.

FIG. 3 is a diagram illustrating an example of a dual shift, in which two chunks of bits, chunk A and chunk B, are shifted to different locations in the barrel shifter. For example, let shift=67, m=18, and n=22. A shift of 67 is appropriate for an LDPC code having a block size of 72. 18 of 22 available arithmetic units are used in the configurable LDPC decoder. shift (mod m)=67 (mod 18)=13, so both chunk A (five bits) and chunk B (13 bits) have the same shift (SHIFT_A=SHIFT_B=13) for an m barrel shifter. However, SHIFT_A=13 and SHIFT_B=17 for n-barrel shifter. FIG. 4 illustrates this point.

FIG. 4 is a more detailed diagram illustrating an example of the dual shift of FIG. 3. As FIG. 4 shows, SHIFT_A for A should be carried out on a first n-barrel shifter, and SHIFT_B for B should be carried out on a second n-barrel shifter. Then, the outputs for A and B should be combined to yield the final shift. From this, the following formulas are derived:

SHIFT_A=shift(mod m)

|A|=m−SHIFT_A

|B|=SHIFT_A

SHIFT_B=n−|A|=n−m+SHIFT_A.

A multi-size barrel shifter that rotates data may be regarded as a Benes network (see, Benes, "Optimal Rearrangeable Multistage Connecting Networks," Bell Syst. Tech. J., 1964, 43, pp. 1641-1656) for arbitrary permutations with depth 2·log₂n−1. The depth of a regular n-barrel shifter is log₂n. For high-speed operation such as an LDPC decoder, it is important to minimize the depth.

Figure 5:
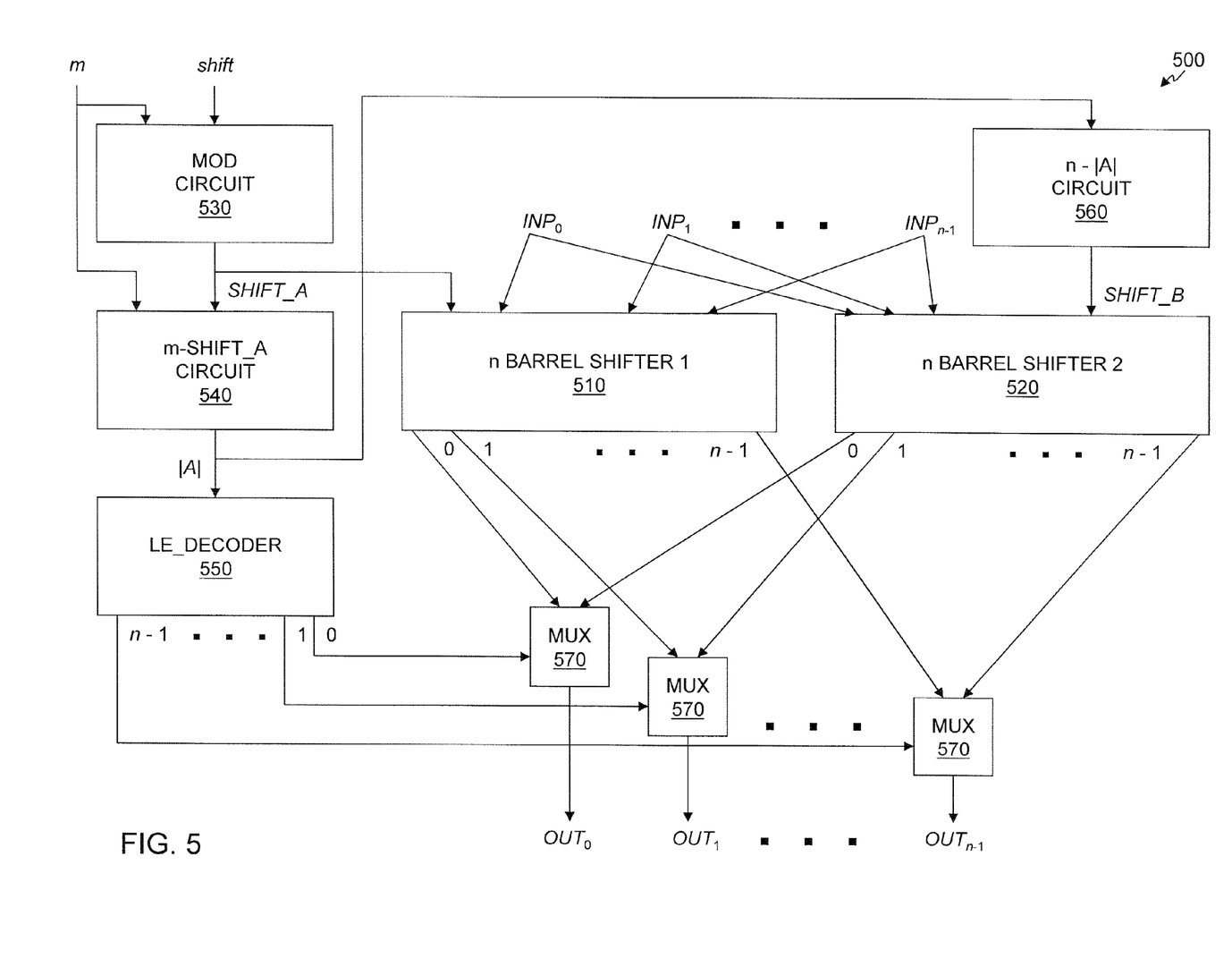
FIG. 5 is a diagram of one embodiment of a barrel shifter that is used in one embodiment of the configurable LDPC decoder of FIG. 2.

FIG. 5 is a diagram of one embodiment of a barrel shifter 500 that is used in one embodiment of the LDPC decoder 140 of FIGS. 1 and 2. The barrel shifter 500 has a depth log₂n+1 and a complexity that, at its limit, is the same as the complexity of a Benes network. Unlike prior art barrel shifters described in Rovini, et al., "Multi-Size Circular Shifting Networks for Decoders of Structured LDPC Codes," Electronics Letters, 16 Aug. 2007, Volume 43, Issue 17, p. 938-940, the barrel shifter of FIG. 5 circuit does not require any pre-procession data and can handle any size in (m≦n) on-the-fly.

The barrel shifter 500 is an (m, n) multi-size barrel shifter having barrel shifter inputs $IN_0, IN_1, \ldots, IN_{n-1}$, two n-barrel shifters 510, 520, a MOD circuit 530, an m-SHIFT_A circuit 540, an LE-DECODER 550, an n−|A| circuit 560 and n multiplexers ("MUX") 570 and barrel shifter outputs $OUT_0, OUT_1, \ldots, OUT_{n-1}$. The n-barrel shifters 510, 520 are configured to receive data through barrel shifter inputs $IN_0, IN_1, \ldots, IN_{n-1}$, and shift chunks A and B of the data in response to SHIFT_A and SHIFT_B, respectively. The MOD circuit 530 is configured to receive shift and m, calculate SHIFT_A=shift(mod m) and provide SHIFT_A to the m-SHIFT_A circuit 540 and the n-barrel shifter 1 510. The m-SHIFT_A circuit 540 is coupled to the MOD circuit 530 and is configured to receive m and SHIFT_A, calculate |A|=m−SHIFT_A and provide |A| to the LE-DECODER 550 and the n−|A| circuit 560. The n−|A| circuit 560 is configured receive |A|, calculate n−|A| and provide n−|A| to the n-barrel shifter 2 520. The LE-DECODER 550 is configured to receive |A| and drive the settings of the n multiplexers 570. The LE DECODER 550 performs the function:

OUT[i]=i≦|A|, ∀i=0, 1, ..., n−1, i.e., the output of the LE_DECODER 550 is equal to 1 on A and equal to 0 on B and the remaining portions of the n-barrel shifters 1 and 2, 510, 520.

Thus, the n multiplexers 570 are configured to select outputs of the barrel shifters 510, 520 based on the output of the LE_DECODER 550, specifically such that the output of the n-barrel shifter 1 510 that contains the shifted chunk A and the output of the n-barrel shifter 2 520 that contains the shifted chunk B are selected, to yield the barrel shifter outputs $OUT_0, OUT_1, \ldots, OUT_{n-1}$.

The data depth (between INP and OUT) of the barrel shifter 500 is log₂n+1 and contains $$2 \cdot \left(\frac{n}{2}\log_2 n\right) + n = n(\log_2 n + 1)$$

switches in two n-barrel switches. This is compared with a Benes network, which has a depth of 2·log₂n−1 and $$n\left(\log_2 n - \frac{1}{2}\right)$$

switches to achieve an arbitrary permutation. The complexity of the MOD circuit 530 is O(log²n). The complexity of the LE_DECODER 550 is O(n), because $$L(n) \leq L\left(\frac{n}{2}\right) + 2n + 1, L(2) = 1.$$

The complexity of each of the m-SHIFT_A circuit 540 and the n−|A| circuit 560 is O(log n). Consequently, the barrel shifter 500 has, at its limit, the same complexity as a Benes network.

Having described several embodiments of an LDPC decoder and arithmetic units and barrel shifters suitable for use in an LDPC decoder, one embodiment of a method of configuring a configurable LDPC decoder may now be described.

Let block_size denote the block size of a particular LDPC code and numb_unit denote the total number of arithmetic units that the configurable LDPC decoder has available to perform parity checks. Let speed_size denote a data rate adjustment; it is the number of block columns to be executed during one clock cycle.

If block_size is divided into m chunks with variable chunk sizes, the following holds:

$$m = \left\lfloor \frac{block\_size}{speed\_size} \right\rfloor.$$

Let norm_chunks be defined as:

$$norm\_chunks = \begin{cases} block\_size(\bmod m), & block\_size(\bmod m) \neq 0 \\ m, & block\_size(\bmod m) = 0. \end{cases}$$

Let chunk_size[i] be defined as the size of the $i^{th}$ chunk, viz.:

$$chunk\_size[i] = \begin{cases} \left\lceil \frac{block\_size}{m} \right\rceil, & 0 \leq i \leq norm\_chunks \\ speed\_size, & norm\_chunks \leq i \leq m. \end{cases}$$

Thus, chunk_size is the number of active arithmetic units for bit nodes.

Figure 6:
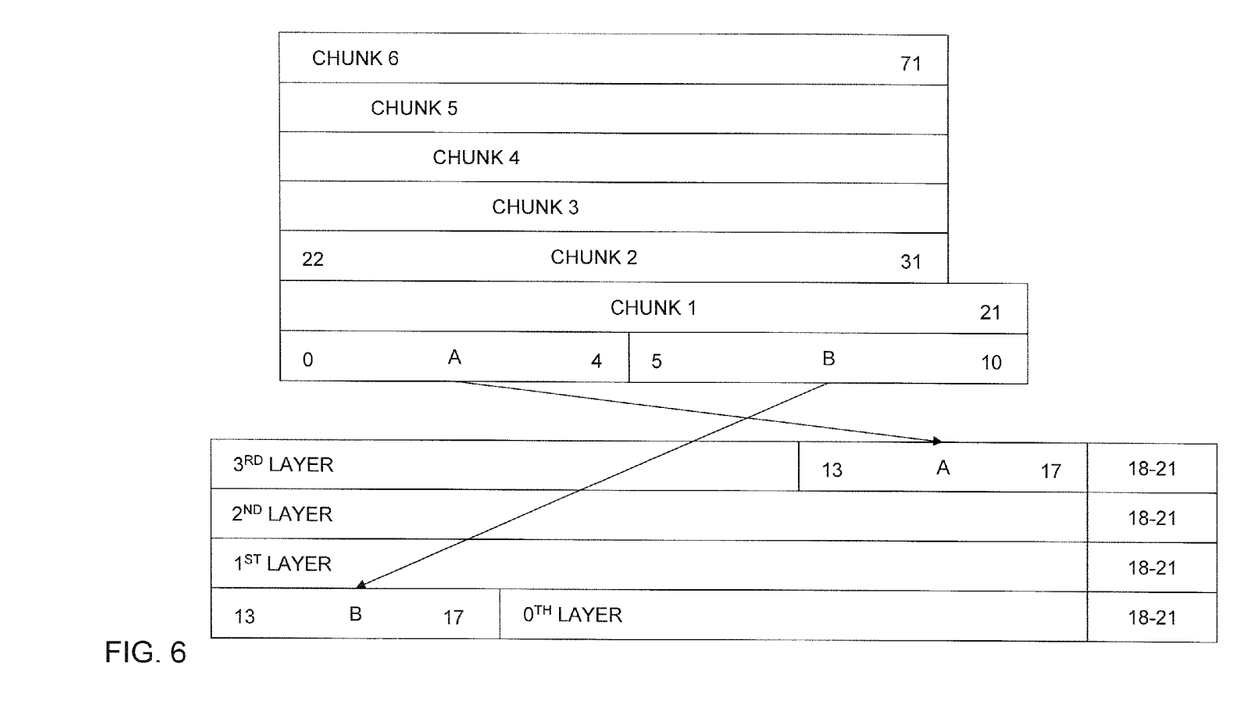
FIG. 6 is a diagram illustrating an example of a block partition for bits and parities assuming block_size=72 and speed_size=10.

FIG. 6 is a diagram illustrating an example of a block partition for bits and parities assuming block_size=72 and speed_size=10. In the example of FIG. 6, m=7, where first the two chunks are 11 bits long, and the remaining five chunks are ten bits long; the number of normal chunks thus equals two.

Let numb_par_unit be defined as the number of active arithmetic units available for parity check:

$$numb\_par\_unit = \left\lceil \frac{block\_size}{n} \right\rceil,$$

where $$n = \left\lceil \frac{block\_size}{numb\_par\_unit} \right\rceil$$

is the number of parity layers.

Let numb_norm_layers define the number of normal parity layers, viz.:

$$numb\_norm\_layers = \begin{cases} block\_size(\bmod n), & block\_size(\bmod n) \neq 0 \\ n, & block\_size(\bmod n) = 0 \end{cases}$$

In the example of FIG. 6 with block_size=72 and numb_unit=22, n=4, numb_par_unit=18 and numb_norm_layers=4. Note that bits (units) 18-21 are not used.

These parameters have the following limitations (to prevent row overlap by parts of a shifted chunk:

$$chunk\_size \leq \begin{cases} numb\_par\_unit, & numb\_norm\_layers = n \\ numb\_par\_unit - 1, & numb\_norm\_layers \neq n \end{cases}$$

Figure 7:
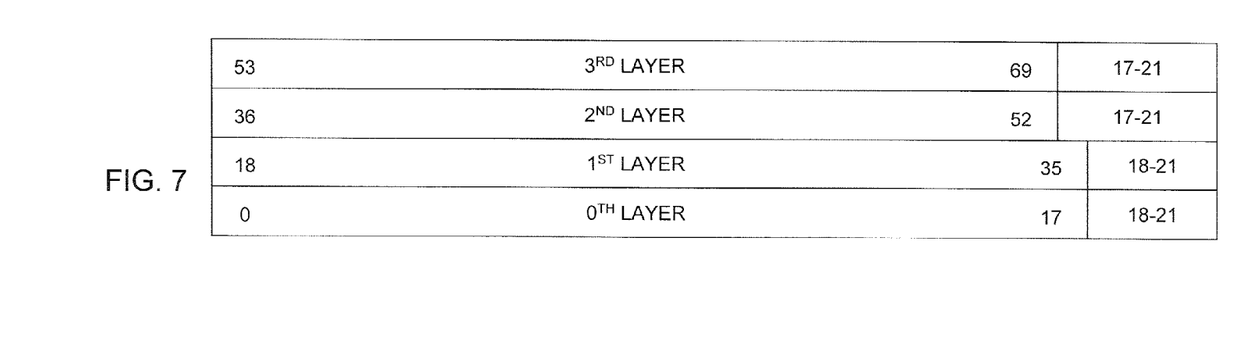
FIG. 7 is a diagram illustrating an example of a block partition for parities assuming block_size=70 and numb_unit=22.

FIG. 7 is a diagram illustrating an example of a block partition for parities assuming block_size=70 and numb_unit=22. In the example of FIG. 7, block_size=70 and numb_unit=22, thus n=4 and numb_norm_layers=2. Per FIG. 7, bits (units) 18-21 are not used for first two normal layers and that bits (units) 17-21 are not used for the remaining two layers.

The calculation of shifts for multi-size partial circular barrel shifters for interconnections between bit node units and parity check units will now be described. SHIFT is defined as follows:

$$SHIFT = \begin{cases} (shift + i \cdot chunk\_size[0])(\bmod block\_size), & i < norm\_chunks \\ (shift + norm\_chunks \cdot chunk\_size[0] + \\ (i - norm\_chunks) \cdot (chunk\_size[0] - 1)) \\ (\bmod block\_size), & i \geq norm\_chunks \end{cases}$$

where shift is the original shift, and i is the starting chunk index.

Thus every chunk of size chunk_size has two parts: a first chunk A with a shift sA and a second chunk B with a shift sB, viz.:

$$start\_layer = \frac{SHIFT}{numb\_par\_unit} \quad (1)$$

$$end\_layer = \frac{(SHIFT + chunk\_size)}{numb\_par\_unit} (\bmod n)$$

$$sA = SHIFT(\bmod numb\_par\_unit)$$

$$A = numb\_par\_unit - sA$$

$$B = chunk\_size - A$$

$$sB = numb\_unit - numb\_par\_unit + sA$$

In the example of FIG. 6:

$$shift = 67$$

$$SHIFT = 67$$

$$numb\_par\_unit = 18$$

$$chunk\_size = 11$$

$$numb\_unit = 22$$

$$start\_layer = \frac{67}{18} = 3$$

$$end\_layer = \frac{(67 + 11)}{18}(\bmod 4) = 0$$

$$sA = 67(\bmod 18) = 13$$

$$A = 18 - 13 = 5$$

$$B = 11 - 5 = 6$$

$$sB = 22 - 18 + 13 = 17$$

Thus first bit of chunk A goes to 0+13=13 from the $3^{rd}$ layer. The first bit of chunk B goes to 5+17=22(mod22)=0 from the $0^{th}$ layer.

Figure 8:
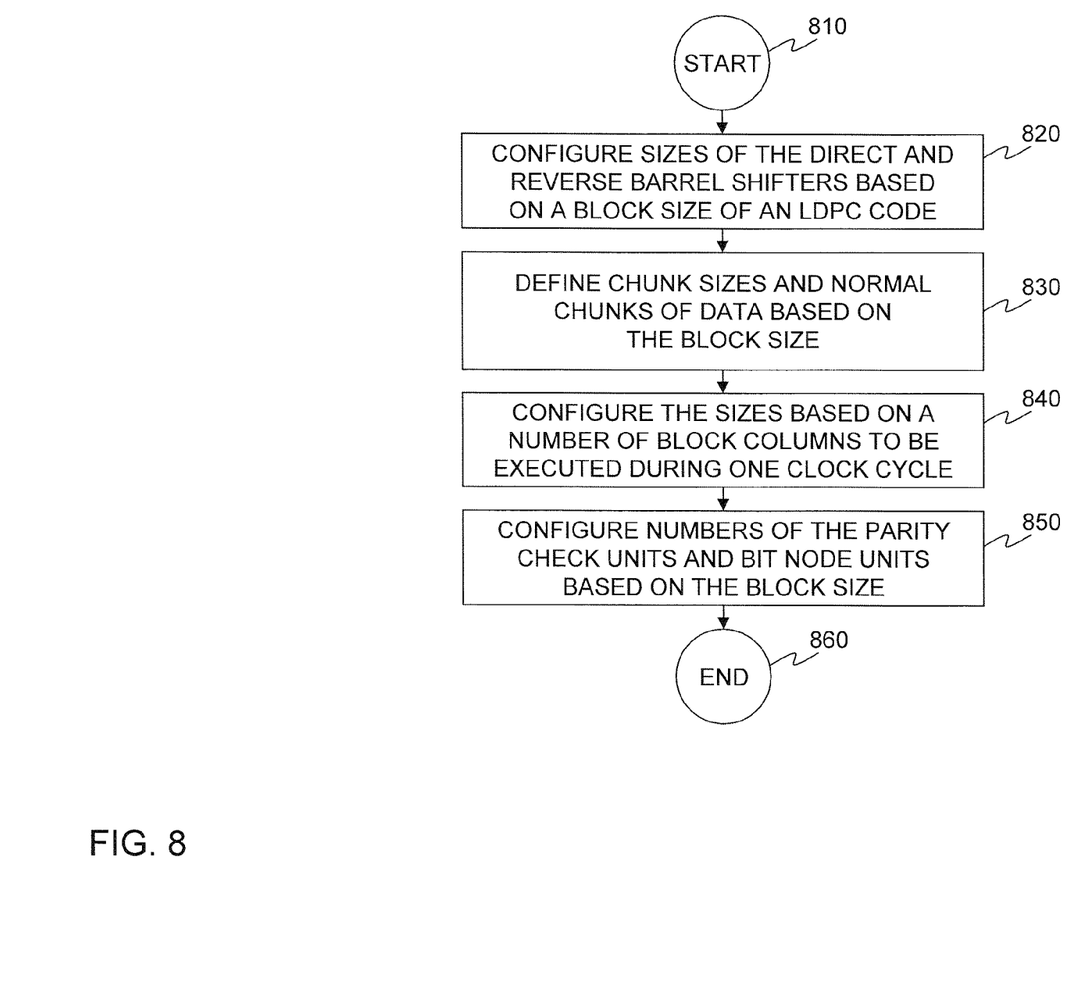
FIG. 8 is a flow diagram of one embodiment of a method of configuring a configurable LDPC decoder carried out according to the principles of the invention.

FIG. 8 is a flow diagram of one embodiment of a method of configuring a configurable LDPC decoder carried out according to the principles of the invention. The method begins in a start step 810. In a step 820, configuring sizes of the direct and reverse multi-size barrel shifters based on a block size of a particular LDPC code. In a step 830, chunk sizes and normal chunks of data are defined based on the block size. In a step 840, the configuring the sizes includes configuring the sizes based on a number of block columns to be executed during one clock cycle. In a step 850, numbers of the pluralities of parity check units and bit node units to cooperate therewith are configured based on the block size. The method ends in an end step 860.

The above-described method may be performed by various conventional digital data processors or computers, wherein the computers are programmed or store executable programs of sequences of software instructions to perform one or more of the steps of the methods, e.g., steps of the method of FIG. 8. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps of the method of FIG. 8.

Those skilled in the art to which the invention relates will appreciate that other and further additions, deletions, substitutions and modifications may be made to the described embodiments without departing from the scope of the invention.

What is claimed is:

1. A configurable low-density parity check code (LDPC) decoder, comprising:
   pluralities of parity check units and bit node units;
   direct and reverse multi-size barrel shifters coupled to said pluralities of parity check units and bit node units; and
   a control circuit, coupled to said pluralities of parity check units and bit node units and said direct and reverse multi-size barrel shifters and configured to configure sizes of said direct and reverse multi-size barrel shifters and numbers of said pluralities of parity check units and bit node units to cooperate therewith based on a block size of a particular LDPC code.

2. The configurable LDPC decoder as recited in claim 1 wherein said direct and reverse multi-size barrel shifters are (m,n) barrel-shifters, each comprising two n-barrel shifters and control circuitry configured to shift chunks of data therein and select said chunks for output thereby.

3. The configurable LDPC decoder as recited in claim 1 wherein said control circuit is configured to define chunk sizes and normal chunks of data based on said block size.

4. The configurable LDPC decoder as recited in claim 1 wherein said control circuit configures said sizes based on a number of block columns to be executed during one clock cycle.

5. The configurable LDPC decoder as recited in claim 2 wherein said control circuit shifts said chunks according to:

$$\text{SHIFT} = \begin{cases} (\text{shift} + i \cdot \text{chunk\_size}[0])(\text{modblock\_size}), & i < \text{norm\_chunks} \\ (\text{shift} + \text{norm\_chunks} \cdot \text{chunk\_size}[0] + \\ (i - \text{norm\_chunks}) \cdot (\text{chunk\_size}[0] - 1)) \\ (\text{modblock\_size}), & i \geq \text{norm\_chunks} \end{cases}$$

where shift is an original shift, and i is a starting chunk index.

6. The configurable LDPC decoder as recited in claim 1 wherein said numbers are equal and said sizes are equal.

7. The configurable LDPC decoder as recited in claim 1 wherein said numbers are such that said LDPC decoder achieves λ-min decoding.

8. A method of configuring a configurable low-density parity check code (LDPC) decoder having pluralities of parity check units and bit node units and direct and reverse multi-size barrel shifters coupled to said pluralities of parity check units and bit node units, comprising:
   configuring sizes of said direct and reverse multi-size barrel shifters based on a block size of a particular LDPC code; and
   configuring numbers of said pluralities of parity check units and bit node units to cooperate therewith based on said block size.

9. The method as recited in claim 8 wherein said direct and reverse multi-size barrel shifters are (m,n) barrel-shifters, each comprising two n-barrel shifters and control circuitry configured to shift chunks of data therein and select said chunks for output thereby.

10. The method as recited in claim 8 wherein said configuring said sizes comprises defining chunk sizes and normal chunks of data based on said block size.

11. The method as recited in claim 8 wherein said configuring said sizes comprises configuring said sizes based on a number of block columns to be executed during one clock cycle.

12. The method as recited in claim 9 further comprising shifting said chunks according to:

$$\text{SHIFT} = \begin{cases} (\text{shift} + i \cdot \text{chunk\_size}[0])(\text{modblock\_size}), & i < \text{norm\_chunks} \\ (\text{shift} + \text{norm\_chunks} \cdot \text{chunk\_size}[0] + \\ (i - \text{norm\_chunks}) \cdot (\text{chunk\_size}[0] - 1)) \\ (\text{modblock\_size}), & i \geq \text{norm\_chunks} \end{cases}$$

where shift is an original shift, and i is a starting chunk index.

13. The method as recited in claim 8 wherein said numbers are equal and said sizes are equal.

14. The method as recited in claim 8 wherein said numbers are such that said LDPC decoder achieves λ-min decoding.

15. A configurable low-density parity check code (LDPC) decoder, comprising:
    pluralities of parity check units and bit node units;
    direct and reverse multi-size (m,n) barrel-shifters coupled to said pluralities of parity check units and bit node units, each of said direct and reverse multi-size (m,n) barrel-shifters including two n-barrel shifters and control circuitry configured to shift chunks of data therein and select said chunks for output thereby; and
    a control circuit, coupled to said pluralities of parity check units and bit node units and said direct and reverse multi-size (m,n) barrel-shifters and configured to configure sizes of said direct and reverse multi-size (m,n) barrel-shifters and numbers of said pluralities of parity check units and bit node units to cooperate therewith based on a block size of a particular LDPC code such that said LDPC decoder achieves λ-min decoding.

16. The configurable LDPC decoder as recited in claim 15 wherein said control circuit is configured to define chunk sizes and normal chunks of data based on said block size.

17. The configurable LDPC decoder as recited in claim 15 wherein said control circuit configures said sizes based on a number of block columns to be executed during one clock cycle.

18. The configurable LDPC decoder as recited in claim 15 wherein said control circuit shifts said chunks according to:

$$\text{SHIFT} = \begin{cases} (\text{shift} + i \cdot \text{chunk\_size}[0])(\text{modblock\_size}), & i < \text{norm\_chunks} \\ (\text{shift} + \text{norm\_chunks} \cdot \text{chunk\_size}[0] + \\ (i - \text{norm\_chunks}) \cdot (\text{chunk\_size}[0] - 1)) \\ (\text{modblock\_size}), & i \geq \text{norm\_chunks} \end{cases}$$

where shift is an original shift, and i is a starting chunk index.

19. The configurable LDPC decoder as recited in claim 15 wherein said numbers are equal and said sizes are equal.

* * * * *